United States Patent
Rai et al.

(10) Patent No.: US 7,940,101 B2
(45) Date of Patent: May 10, 2011

(54) SLEW RATE CONTROL FOR A LOAD SWITCH

(75) Inventors: Abhay Kumar Rai, Fort Collins, CO (US); Ronald Dean Gillingham, Loveland, CO (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 155 days.

(21) Appl. No.: 12/199,890

(22) Filed: Aug. 28, 2008

(65) Prior Publication Data

US 2010/0052755 A1  Mar. 4, 2010

(51) Int. Cl.
*H03K 5/12* (2006.01)
(52) U.S. Cl. ...................................................... 327/170
(58) Field of Classification Search .................. 327/170, 327/171, 365, 376, 377, 379–381, 384, 387, 327/388
See application file for complete search history.

(56) References Cited

U.S. PATENT DOCUMENTS

| | | | |
|---|---|---|---|
| 6,181,093 B1 * | 1/2001 | Park et al. | 318/400.34 |
| 6,222,403 B1 * | 4/2001 | Mitsuda | 327/170 |
| 6,489,829 B1 * | 12/2002 | Yu | 327/379 |
| 7,378,878 B2 * | 5/2008 | Major | 326/87 |
| 2009/0015977 A1 * | 1/2009 | Patel | 361/92 |

OTHER PUBLICATIONS

High Side Power Switches, Micrel Inc., Feb. 2007, available at http://www.micrel.com/_PDF/mic94062-63.pdf#page=6, last visited Aug. 27, 2008.
Advanced Analogic Technologies "AAT4250 Slew Rate Controlled Load Switch", http://www.analogictech.com/products/digitalfiles/AAT4250.pdf, Mar. 9, 2006, 1-13.

\* cited by examiner

*Primary Examiner* — Hai L Nguyen

(57) ABSTRACT

An apparatus for slew rate control using a plurality of discrete slew rate levels. The apparatus includes a load switch and a switch controller. The load switch outputs a load voltage to a load. The switch controller generates a switch control signal in response to an enable signal. The switch control signal controls operation of the load switch. The switch controller controls a slew rate of the load switch according to a plurality of discrete slew rate levels.

9 Claims, 8 Drawing Sheets

SLEW RATE CONTROL FOR A LOAD SWITCH

BACKGROUND OF THE INVENTION

Slew rate refers to the rate of change of a signal voltage in a circuit. Slew rate control is used to slow down the rising edge of a source voltage signal (VDD) to avoid supply transients while switching. In conventional applications, a high side switch is used to control slew rate as a power down feature of a chip. For example, when an enable signal (EN) is high, the high side switch supplies VDD to the chip. When EN is low, the high side switch puts the chip into a power down mode.

In some of the conventional implementations, slew rate control for a high side switch uses a level shifter which controls the slew rate in one step. Level shift circuitry to control a high side switch does not have any variable control over the slew rate because the level shift circuitry can only control slew in one step during the time the level shift circuitry is activated. In particular, when a control voltage pulse is applied to the input of the level shifter, the level shifter merely shifts the input voltage to generate the output voltage, which typically controls the slew rate according to a substantially linear progression.

Other conventional implementations control slew rate using a switch in combination with the level shifter. In this implementation, the level shifter initially turns on to control the slew rate in a substantially linear manner, as described above. Subsequently, at a predetermined output voltage, a switch is closed to change the functionality of the level shifter to operate similar to an inverter. By operating similar to an inverter, the high side switch can turn on faster relative to the operation of the high side switch when the level shifter is operational. However, the operation of the level shifter as an inverter does not control the slew rate.

Both of these conventional implementations merely control the slew rate during the operation of the level shifter. In contrast, there is no slew rate control before the time the level shifter is operational. Similarly, there is no slew rate control after the time that the level shifter operation ends, regardless of whether or not the level shifter operates as an inverter.

SUMMARY OF THE INVENTION

Embodiments of an apparatus are described. In one embodiment, the apparatus is an apparatus for slew rate control. The apparatus includes a load switch and a switch controller. The load switch outputs a load voltage to a load. The switch controller generates a switch control signal in response to an enable signal. The switch control signal controls operation of the load switch. The switch controller controls a slew rate of the load switch according to a plurality of discrete slew rate levels. Other embodiments of the apparatus are also described.

Embodiments of a system are also described. In one embodiment, the system is an electronic device. The electronic device includes a load chip, a load switch, and a switch controller. The load chip includes electronic circuitry. The load switch supplies a load voltage to the load chip. The switch controller controls a slew rate of the load switch according to a plurality of discrete slew rate levels.

In one embodiment of the described system, the switch controller includes a resistive network and a resistive network controller. The resistive network controller activates the resistive network to generate a switch control signal in response to an enable signal. The switch control signal varies over time according to the plurality of discrete slew rate levels.

In another embodiment of the described system, the load switch includes a plurality of switches and a common output channel coupled to the plurality of switches. Additionally, the switch controller includes a plurality of cascaded buffers and a plurality of switch control channels. The cascaded buffers delay an enable signal and generate a corresponding plurality of switch control signals. The switch control signal channels are coupled to the cascaded buffers and to the plurality of switches in the load switch. The switch control signal channels send the switch controls signals to corresponding switches in the load switch. The load switch accumulates the switch control signals over time to discretely vary a magnitude of the load voltage over time. Other embodiments of the system are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
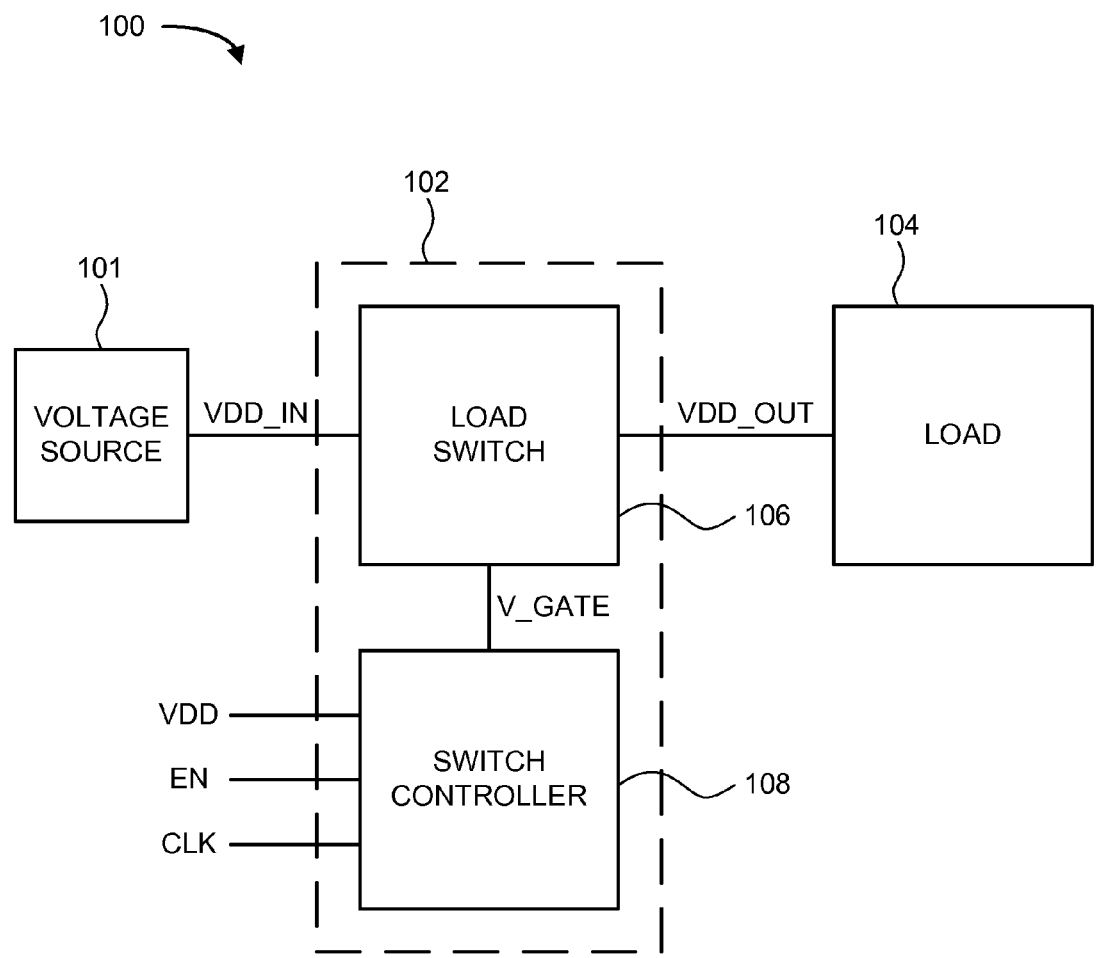
FIG. 1 depicts a schematic block diagram of one embodiment of an electronic device.

While many embodiments are described herein, at least some of the described embodiments implement a switch controller for a load switch to control a slew rate of the load switch using multiple steps, or discrete slew rate levels. In some embodiments, the load switch is implemented and referred to as a high side switch, or a high side power switch, which includes one or more p-type metal-oxide semiconductor (PMOS) transistors.

In general, at least two embodiments of an electronic device are described which can control the load switch to turn on and off the load switch in several steps. Embodiments of the electronic device include a load chip, a load switch, and a switch controller. The load chip includes electronic circuitry. The load switch supplies a load voltage to the load chip. The switch controller controls a slew rate of the load switch according to a plurality of discrete slew rate levels. By turning the load switch on and off, or turning it on in an incremental manner, the switch controller can effectively control the slew of the load switch. In some embodiments, the switch controller also may delay turning on the load switch, which effectively suppresses the switching noise from the power supply.

In one embodiment, the switch controller includes a resistive network and a resistive network controller. The resistive network controller activates the resistive network to generate a switch control signal in response to an enable signal (EN). The switch control signal varies over time according to the plurality of discrete slew rate levels. More specifically, in some embodiments, the resistive network controller controls the resistive network to activate different resistive channels, or combinations of resistive channels, to discretely vary the voltage level of the switch control signal over time. In these embodiments, the load switch may include a single PMOS transistor controlled by a single switch control signal or, alternatively, may include multiple PMOS transistors controlled by a corresponding number of switch control signals. Where multiple PMOS transistors are implemented in the load switch, the load voltage presented by the load switch to the load may be an accumulation of individual load switch voltages from the individual PMOS transistors.

In another embodiment, the switch controller includes a plurality of cascaded buffers and a plurality of switch control channels, rather than a resistive network. The cascaded buffers delay the enable signal (EN) and generate a corresponding plurality of switch control signals. The switch control signal channels are coupled to the cascaded buffers and to a corresponding plurality of switches in the load switch. The switch control signal channels send the switch controls signals to corresponding switches in the load switch. The load switch accumulates the load switch voltages from the individual PMOS transistors, based on the corresponding switch control signals, over time to discretely vary a magnitude of the load voltage presented to the load chip.

Whether the switch controller is implemented using resistive networks or delay networks, the switch controller functions with the load switch to discretely vary the magnitude of the load voltage presented to the load chip. By controlling the magnitude of the load voltage in discrete steps, the slew rate of the load switch can be controlled according to the constraints of the electronic device in which the load switch is implemented. Other embodiments may be implemented to achieve the same or similar control over the slew rate of the load switch.

FIG. 1 depicts a schematic block diagram of one embodiment of an electronic device 100. The illustrated electronic device 100 is representative of any type of electronic circuitry which may include a load switch. Some examples of electronic devices which include a load switch include portable devices such as cellular telephones, personal digital assistants (PDAs), music players (e.g., an MP3 player), digital cameras, notebook computers, and portable instrumentation. Other examples of electronic devices which may include a load switch include hot swap supplies, battery switch-over circuits, and level translators. Additionally, although the electronic device 100 is shown and described with certain components and functionality, other embodiments of the electronic device 100 may include fewer or more components to implement less or more functionality.

The illustrated electronic device 100 includes a voltage source 101, a slew rate controller 102, and a load 104. The slew rate controller 102 includes a load switch 106 and a switch controller 108. In some embodiments, the load switch 106 is a high side switch, although other embodiments may use other types of switches. Hence, references to a high side switch are generally intended to refer to the load switch 106, generally, unless indicated otherwise.

In general, the load switch 106 receives an input voltage (VDD_IN) from the voltage source 101. In one embodiment, the input voltage is received via an input voltage channel (VDD_IN). As a matter of convenience, the signal channel(s) and the signal(s) carried by the corresponding signal channel(s) are referred to herein by a common designation. For example, the VDD_IN channel carries the VDD_IN signal.

The switch controller 108 is coupled to the load switch 106. In one embodiment, the switch controller 108 generates one or more switch control signals (V_GATE) in response to an enable signal (EN). The enable signal may originate externally from the switch controller 108 or, alternatively, internally to the switch controller 108. In some embodiments, the switch controller 108 also receives a voltage source signal (VDD) from the voltage source 101 or from another source. In some embodiments, the switch controller 108 also receives a clock signal (CLK) from a clock source such as an oscillator. Alternatively, the voltage source signal and/or the clock signal may originate from within the switch controller 108. Other embodiments may omit the voltage source signal channel and/or the clock channel.

The switch control signal(s) controls operation of the load switch 106. In this way, the switch controller 108 controls a slew rate of the load switch 106 according to a plurality of discrete slew rate levels, rather than a single step. By controlling the slew rate of the load switch 106, the load switch 106 outputs a controlled load voltage (VDD_OUT) to the load 104. Various examples of load switches 106 and corresponding switch controllers 108 are described herein.

In some embodiments, the switch controller 108 is configured to discretely vary a magnitude of the switch control signal to control the slew rate of the load switch 106. In some embodiments, the switch controller 108 is configured to send the switch control signal to the load switch 106 to change the load voltage, which is output by the load switch, from an initial load voltage to a final load voltage over a period of time.

Figure 2:
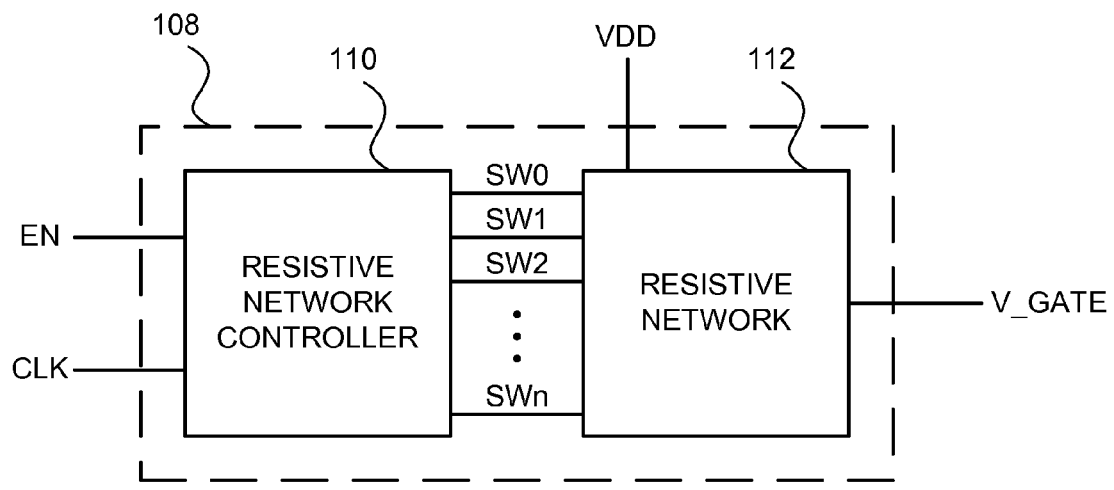
FIG. 2 depicts a schematic block diagram of one embodiment of the switch controller of the electronic device of FIG. 1.

FIG. 2 depicts a schematic block diagram of one embodiment of the switch controller 108 of the electronic device 100 of FIG. 1. The illustrated switch controller 108 includes a resistive network controller 110 and a resistive network 112. In general, the resistive network 112 includes a plurality of resistors and a corresponding plurality of switches. The resistive network controller 110 controls the switches within the resistive network 112 (e.g., using the resistive network control signals SW0-SWn, where n+1 represents the number of switches) to generate a plurality of voltage levels. In one embodiment, each voltage level corresponds to a discrete magnitude of the switch control signal (V_GATE). Although the switch controller 108 is shown and described with certain components and functionality, other embodiments of the switch controller 108 may include fewer or more components to implement less or more functionality.

The illustrated switch controller 108 uses the enable signal (EN) to enable the resistive network controller 110. The resistive network controller 110 also uses the clock signal (CLK), and the resistive network 112 uses the voltage source signal (VDD), as described in more detail with reference to FIG. 3.

Figure 3:
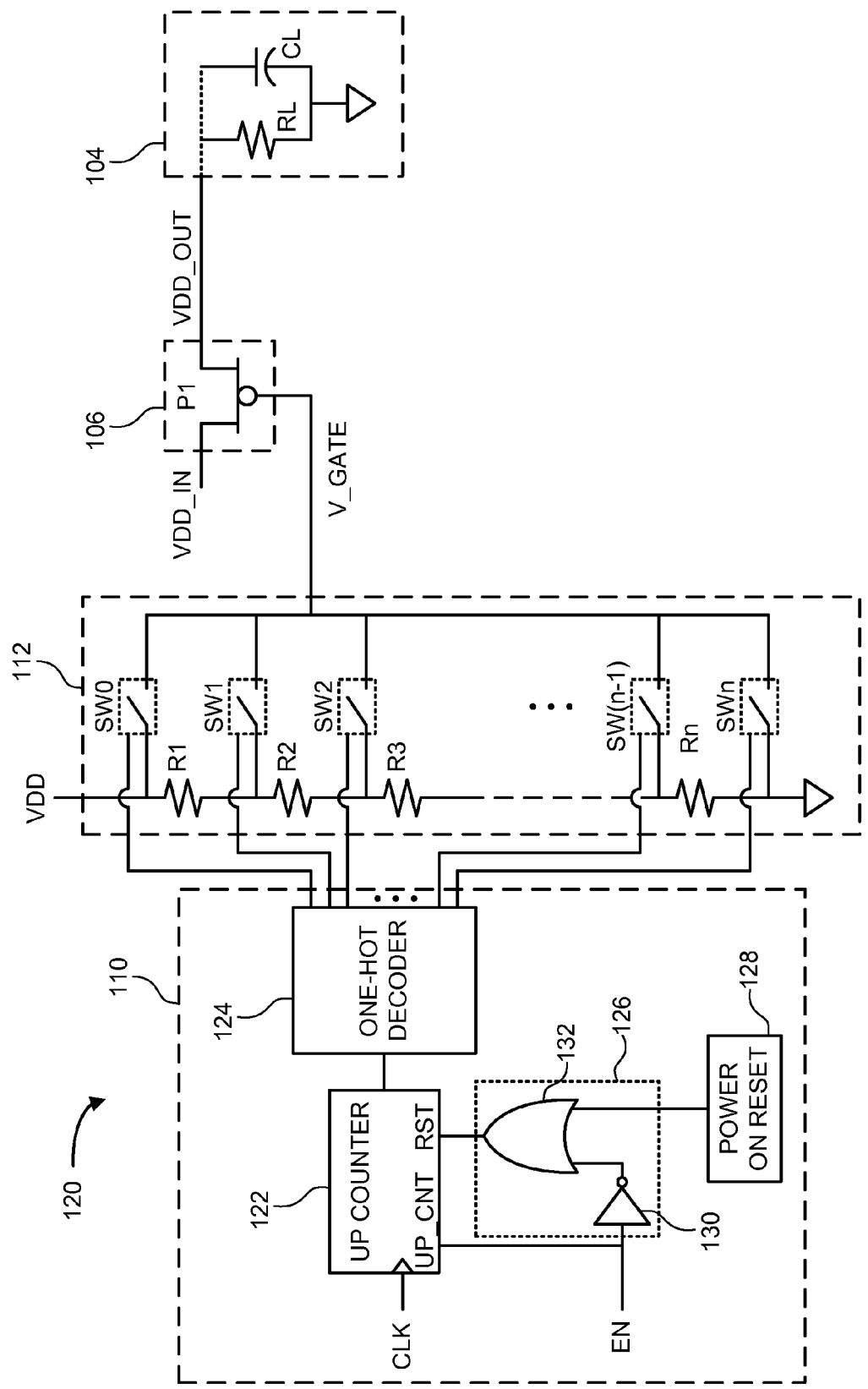
FIG. 3 depicts a schematic diagram of another embodiment of an electronic device with a specific implementation of the switch controller of FIG. 2.

FIG. 3 depicts a schematic diagram of another embodiment of an electronic device 120 with a specific implementation of the switch controller 108 of FIG. 2. In particular, the switch controller 108 is implemented by the resistive network controller 110 and the resistive network 112. The electronic device 120 also includes an implementation of the load switch 106 and an equivalent circuit for the load 104. Although the electronic device 120 is shown and described with certain components and functionality, other embodiments of the electronic device 120 may include fewer or more components to implement less or more functionality.

In one embodiment, the resistive network controller 110 includes a counter 122, a decoder 124 (e.g., a one-hot decoder), reset logic 126, and power on reset (POR) logic 130. In one embodiment, the counter 122 is an up counter which advances, or increments, an output count on each clock cycle (e.g., rising edge of the clock signal) while the enable signal is asserted. Alternatively, a down counter may be used instead of an up counter. The counter 122 resets the output count in response to the reset signal. Additionally, the counter 122 may have a count limit which limits the output count to a maximum count. For example, the counter 122 may maintain the output count at a maximum of 10, even though the counter 122 recognizes more than ten consecutive clock cycles.

In one embodiment, the decoder 124 receives the output count from the counter 122 and generates a corresponding resistive network control signal SW0-SWn. Each resistive network control signal controls a corresponding switch in the resistive network 112. More specifically, the decoder 124 may selectively turn on individual switches, or combinations of switches, within the resistive network 112. The resistive network control signals SW0-SWn are transmitted to the resistive network 112, for example, via corresponding resistive network control signal channels.

In one embodiment, the POR logic 128 generates a POR signal, and the reset logic 126 resets the counter 122 based on a combination of the POR signal and the enable signal. In the illustrated embodiment, the reset logic 126 includes an inverter 126 and an OR gate 128 (although other logic gates may be used) to generate a reset signal (RST) based on the POR signal and the enable signal.

In one embodiment, the resistive network 112 includes a configuration of switches SW0-SWn (using the same designations as the corresponding resistive network control signals and channels) and resistors R0-R(n−1). The resistive network 112 also includes a voltage source channel (VDD) coupled to the configuration of switches and resistors. In one embodiment, the resistors are arranged in series between the voltage source channel and a ground reference. By coupling the switches between the resistors, as shown, the resistors and switches within the resistive network 112 form a plurality of voltage divider arrangements. This allows the resistive network controller 110 to independently control each of the switches to present a specific voltage on a common output channel coupled to all of the switches. The output voltage from the resistive network 112 serves as the switch control signal (V_GATE) to control the load switch 106. In an alternative embodiment, the resistive network 112 may incorporate a digital-to-analog converter (DAC) such as an R-2R resistor ladder to generate a more accurate reference voltage and/or to avoid the potential divider arrangement.

The following table provides an example of a substantially linear relationship among the voltage levels (relative to VDD) generated by turning on each of eleven switches, designated as SW0-SW10 in the resistive network 112.

| SWITCH | V_GATE |
|---|---|
| SW0 | VDD |
| SW1 | 0.9 VDD |
| SW2 | 0.8 VDD |
| SW3 | 0.7 VDD |
| SW4 | 0.6 VDD |
| SW5 | 0.5 VDD |
| SW6 | 0.4 VDD |
| SW7 | 0.3 VDD |
| SW8 | 0.2 VDD |
| SW9 | 0.1 VDD |
| SW10 | 0.0 |

In the illustrated embodiment, the load switch 106 includes a single p-type metal-oxide semiconductor (PMOS) high side switch (P1). The switch control signal (V_GATE) from the resistive network 112 controls a gate of the PMOS switch P1, which controls how much of the input voltage (VDD_IN) at the source is available to the load 104 as the load voltage (VDD_OUT) at the drain.

Since the load switch 106 drives the load 104, the associated driving capacitance may be very high. Thus, it may be useful to supply a relatively high amount of current to the load 104. Therefore, the load 104 driven by the load switch 106 may be modeled as a high capacitance current load with a capacitance (CL) of about 1 µF. A model resistance (RL) is shown in parallel with the model capacitance. As one example, the model resistance may be about VDD/50 mA to deliver about 50 mA of current. Other embodiments of the load 104 may use other types of loads or load parameters.

Figure 4:
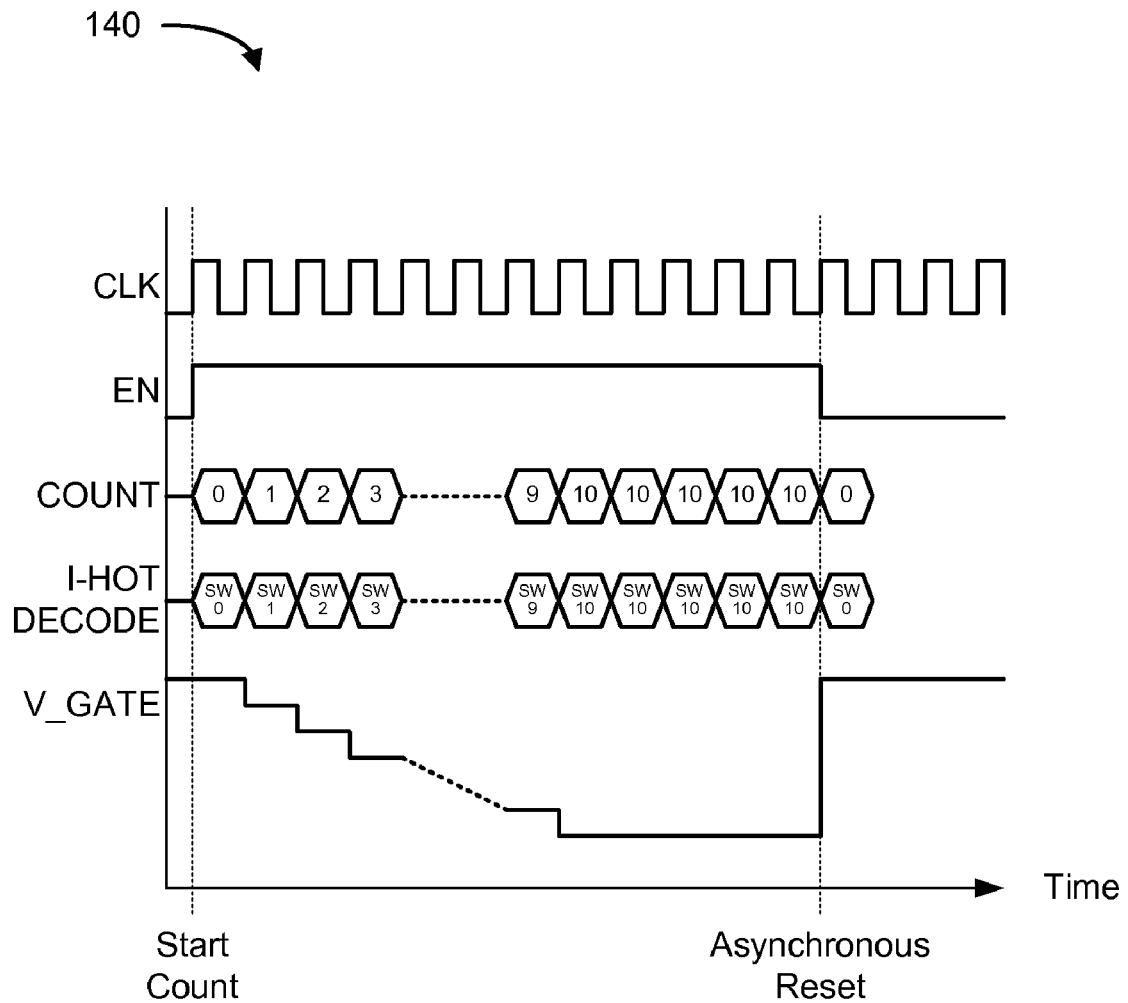
FIG. 4 depicts a timing diagram for the switch controller of FIG. 2 within the electronic device of FIG. 3.

As a more detailed example of the functionality of the electronic device 120, assume the counter 122 is initially disabled, for example, when the enable signal is deasserted. Alternatively, the counter 122 may be enabled with the reset signal asserted. While the counter 122 is disabled, the one-hot decoder 124 maintains the switch SW0 closed so that the switch control signal (V_GATE) is VDD. This keeps the PMOS transistor P1 turned off. This state is shown in FIG. 4, which illustrates a timing diagram 130 for the switch controller 108 of FIG. 2 within the electronic device 120 of FIG. 3. In particular, this state is illustrated prior to the vertical dashed line designated as "Start Count."

Once the enable signal is asserted, the counter 122 starts the count at 0000. In one embodiment, the one-hot decoder 124 receives the count 0000 and maintains the resistive network control signal asserted for the switch SW0. On the next clock cycle (e.g., the next rising edge of the clock signal), the counter 122 increments the count to 0001. The one-hot decoder 124 receives the incremented count 0001 and manipulates the resistive network control signals to open the switch SW0 and to close the switch SW1. By opening the switch SW0 and closing the switch SW1, the resistive network 112 sends a switch control signal with a lower voltage level to the PMOS transistor P1. Accordingly, the PMOS transistor P1 may turn on slightly.

The counter 122 continues to increment the count with each clock cycle until the count reaches a maximum count (e.g., 1010 for a resistive network with 11 switches, i.e., n=11). With each incremented count value, the one-hot decoder 124 continues to sequentially turn on individual switches within the resistive network 112 and, hence, decrease the voltage level of the switch control signal presented at the gate of the PMOS transistor P1. Once the last switch is turned on in the resistive network 112, the voltage level of the switch control signal is 0 V, so the PMOS transistor P1 is fully turned on. In one embodiment, the count remains at the maximum count and, hence, the load switch 106 remains turned on until the counter 122 is reset, at which time the switch control signal (V_GATE) returns to VDD and the PMOS transistor P1 is fully turned off. The timing diagram 140 of FIG. 4 indicates one embodiment of an "Asynchronous Reset" to reset the counter 122. Other embodiments may implement other types of reset operations.

By using this embodiment of the electronic device 120, with the resistive network 112 and the resistive network controller 110, it is possible to control the slew of the load switch 106 by controlling the gate voltage of the PMOS transistor P1 in several small steps. In other words, the slew rate of the load switch 106, and the load voltage presented to the load 104, can be controlled according to a plurality of discrete slew rate levels corresponding to the voltage divider arrangement in the resistive network 112. In one embodiment, the PMOS transistor P1 is a very large PMOS in order to support a relatively high amount of current.

Additionally, a variety of configurations can be implemented depending on the parameters of the various components within the electronic device 120. For example, the resistors in the resistive network 112 may have resistance values which implement a substantially linear slew rate of the load switch 106. Alternatively, the resistors in the resistive network 112 may have resistance values which implement a non-linear slew rate of the load switch 106. For example, the reference voltages generated by the resistive network 112, may be non-linear by having smaller potential steps corresponding to the beginning resistors and larger potential steps corresponding to the latter resistors. Also, the switches may be turned on in another order, instead of sequentially based on relative position within the resistive network 112.

In some embodiments, the counter 122 may be configured to count faster or slower than the speed of the clock. In other embodiments, the counter 122 may count down, rather than up, and/or the decoder 124 may use other control logic to determine which switches to open and close within the resistive network 112. In some embodiments, it may be useful to allow a user or device manager (not shown) to store operating parameters within a memory device (not shown) to control one or more of the components within the electronic device. For example, the slew rate controller 102 may adjust the operation of the decoder 124 to speed up or slow down the slew rate of the load switch 106, depending on historical data or contemporary voltage measurements.

In some embodiments, it may be useful to delay opening the load switch 106 for a certain period after the enable signal is asserted. Delaying turning on the PMOS transistor P1 may help prevent switching transients generated due to switching of the voltage source 101, or another power supply. In one embodiment, the counter 122 may begin incrementing the count, and the decoder 124 may be configured to leave the switch SW0 closed until after a certain number of clock cycles. For example, the decoder 124 may wait until count 0100 before closing switch SW0 and opening switch SW1. In some embodiments, additional delay may be implemented between consecutive switching stages. For example, wither reference to the example voltage levels shown in the table above, two cycles of delay may be implemented between the 0.9 VDD voltage level and the 0.8 VDD voltage level, and one cycle of delay may be implemented between the 0.8 VDD voltage level and the 0.7 VDD voltage level. Other embodiments may implement other delay techniques.

Additionally, although the illustrated embodiment of the electronic device 120 is shown and described with a relative assertion level (e.g., active low or active high), other embodiments may be implemented with complementary technology or a combination of components with different assertion protocols. For example, the switch controller 108 may control the switch control signal (V_GATE) to increase over time, and the load switch 106 may turn on in response to the increasing voltage levels, rather than turn on in response to decreasing voltage levels. Other embodiments may implement other configurations using contemporaneous technology.

Figure 5:
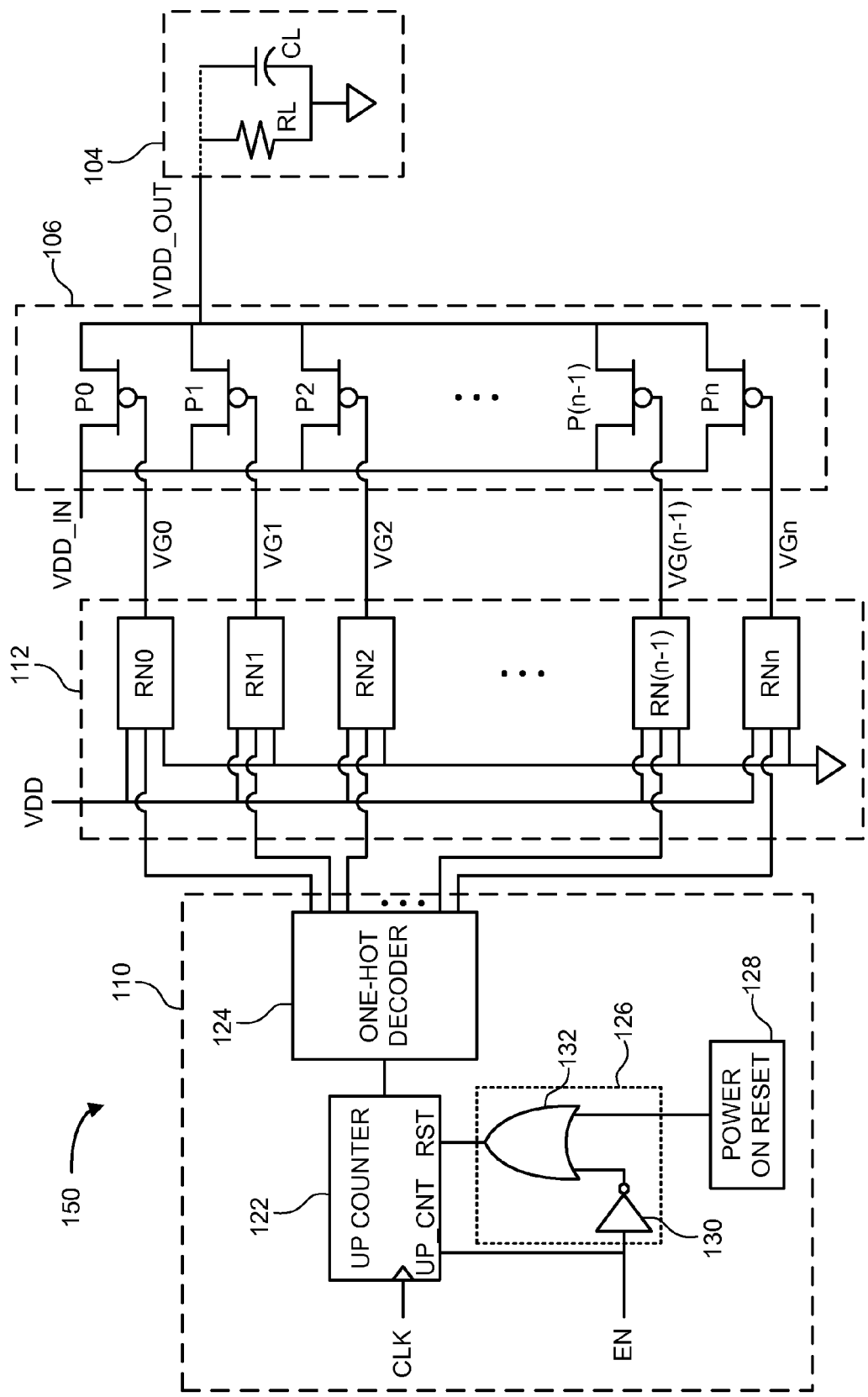
FIG. 5 depicts a schematic diagram of another embodiment of an electronic device with another implementation of the switch controller of FIG. 2.

FIG. 5 depicts a schematic diagram of another embodiment of an electronic device 150 with another implementation of the switch controller 108 of FIG. 2. In many aspects, the physical components and functionality of the illustrated electronic device 150 of FIG. 5 are substantially similar to the components and functionality of the electronic device 120 of FIG. 3. For example, the resistive network controller 110 is shown in FIG. 5 as including the same components as shown in FIG. 3 and described above. Similarly, the load 104 shown in FIG. 5 is represented by the same equivalent circuit shown in FIG. 3 and described above.

The illustrated electronic device 150 differs in some aspects from the electronic device 120 of FIG. 3 in the layout and functionality of the resistive network 112 and the load switch 106. In particular, the load switch 106 includes multiple switches (P0-Pn) which have all the sources connected together and all the drains connected together. The gates of the several switches P0-Pn are individually controlled by the switch controller 108 to control the slew rate of the load switch 106.

In the depicted embodiment, the resistive network 112 includes a plurality of individual resistive networks, which are designated as RN0-RNn. Each individual resistive network RN includes at least one resistive element (e.g., resistor) and at least one switch. The resistive network controller 110 selectively operates at least one of the resistive networks to generate one of a plurality voltage levels. Each voltage level corresponds to a discrete magnitude of the switch control signal.

Additionally, the resistive network 112 includes a common voltage source (VDD) channel coupled to each of the resistive networks RN0-RN1, and a common ground reference coupled to each of the resistive networks RN0-RN1, several independent output channels (VG0-VGn). Each output channel VG0-VGn is coupled to a corresponding resistive network RN0-RNn to present a corresponding switch control signal (also designated as VG0-VGn) to the load switch 106. More specifically, the switch control signal from the resistive network 112 to the load switch 106 may include a plurality of individual switch control signals VG0-VGn, which are transmitted to the corresponding switches (P0-Pn) within the load switch 106.

In the illustrated embodiment, the individual switches P0-Pn within the load switch 106 include a plurality of p-type metal-oxide semiconductor (PMOS) high side switches. As described above, the output channel VG0-VGn of each resistive network RN0-RNn is coupled to a gate of the corresponding PMOS high side switch P0-Pn. The load switch 106 also includes a common input voltage (VDD_IN) channel coupled to the sources of all of the PMOS high side switches P0-Pn. The load switch 106 also includes a common output voltage (VDD_OUT) channel coupled to the drains of all of the PMOS high side switches P0-Pn. In this way, the common output voltage channel is configured to present the cumulative load voltage to the load 104.

As one example of the operation of the illustrated electronic circuit 150, the resistive network controller 110 may successively turn on each resistive network RN0-RNn within the resistive network 112 on successive clock cycles. In contrast to the electronic device 120 of FIG. 3, in which only one switch SW0-SWn within the resistive network 112 is active at a time, some embodiments of the illustrated electronic device 150 of FIG. 5 allow multiple resistive networks RN0-RNn to be concurrently active. This allows multiple PMOS high side switches P0-Pn to be concurrently active and, hence, send a cumulative load voltage to the load 104. Other embodiments independently activate the resistive networks RN0-RNn within the resistive network 112 so that only one resistive network is active at a time, similar to the electronic device 120 of FIG. 3.

Figure 6:
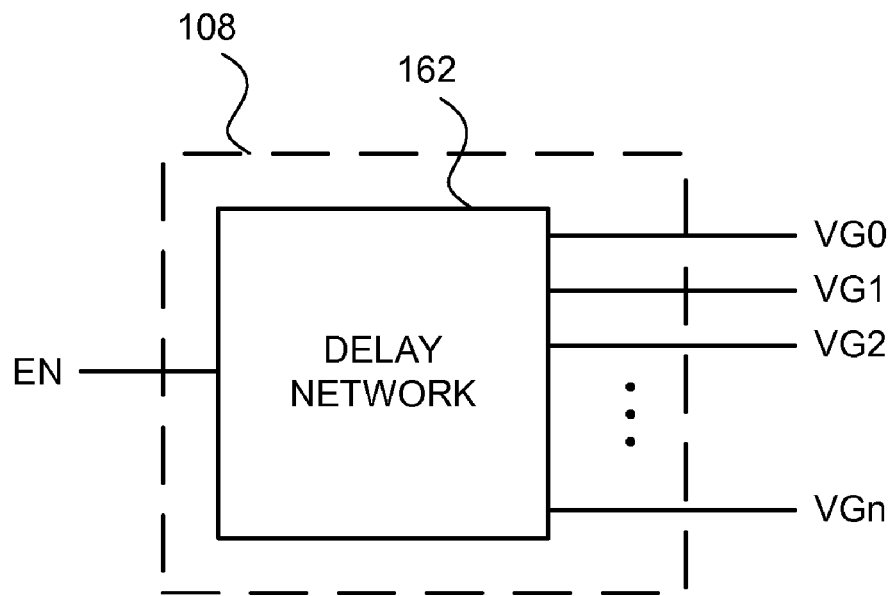
FIG. 6 depicts a schematic block diagram of another embodiment of the switch controller of the electronic device of FIG. 1.

FIG. 6 depicts a schematic block diagram of another embodiment of the switch controller 108 of the electronic device 100 of FIG. 1. Rather than implementing a resistive network 112 and a resistive network controller 110, the illustrated switch controller 108 implements a delay network 162. In one embodiment, the delay network 162 generates a plurality switch control signals (VG0-VGn), similar to the switch controller 108 of FIG. 5. The delay network 162 sends at least one of the switch control signals VG0-VGn to the load switch 106. One example of the delay network 162 is shown in FIG. 8 and described in more detail below.

Figure 7:
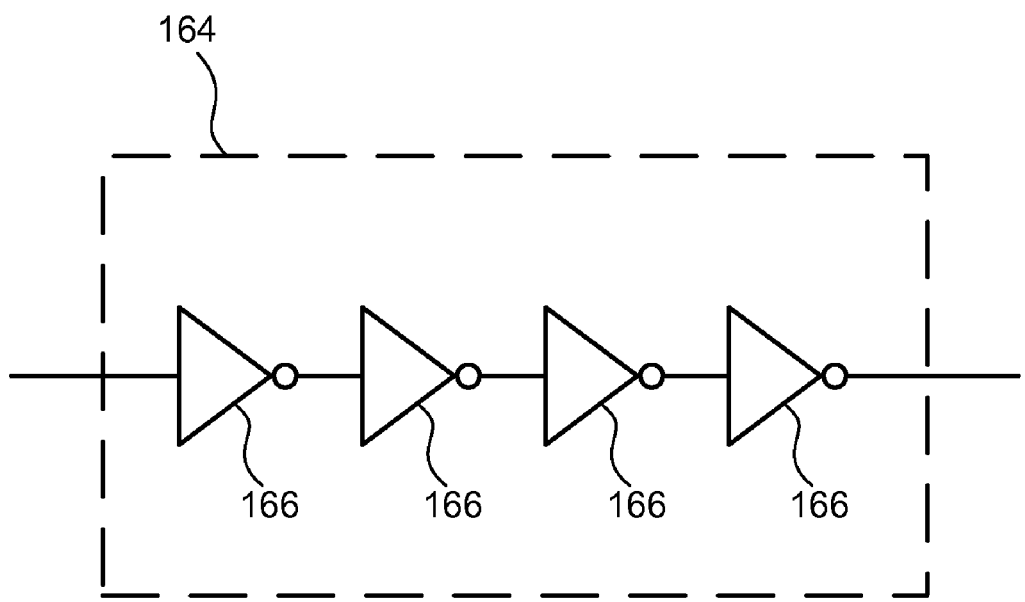
FIG. 7 depicts a schematic diagram of one embodiment of a buffer for use in the delay network of the switch controller of FIG. 6.

FIG. 7 depicts a schematic diagram of one embodiment of a buffer 164 for use in the delay network 162 of the switch controller 108 of FIG. 6. The illustrated buffer 164 includes several inverters 166 connected in series. In some embodiments, each buffer 164 includes an inverter chain with at least one inverter 166 coupled in series between a buffer input and a buffer output. Since each inverter 166 has an inherent delay in transmitting the input signal to the output, the buffer 162 has a resulting gate delay to delay the output from the inverter chain. Although a specific number and configuration of inverters 166 are shown in the buffer 164 of FIG. 7, other embodiments, may use fewer or more inverters 166 and/or different series and parallel configurations of inverters 166 or other delay logic.

Figure 8:
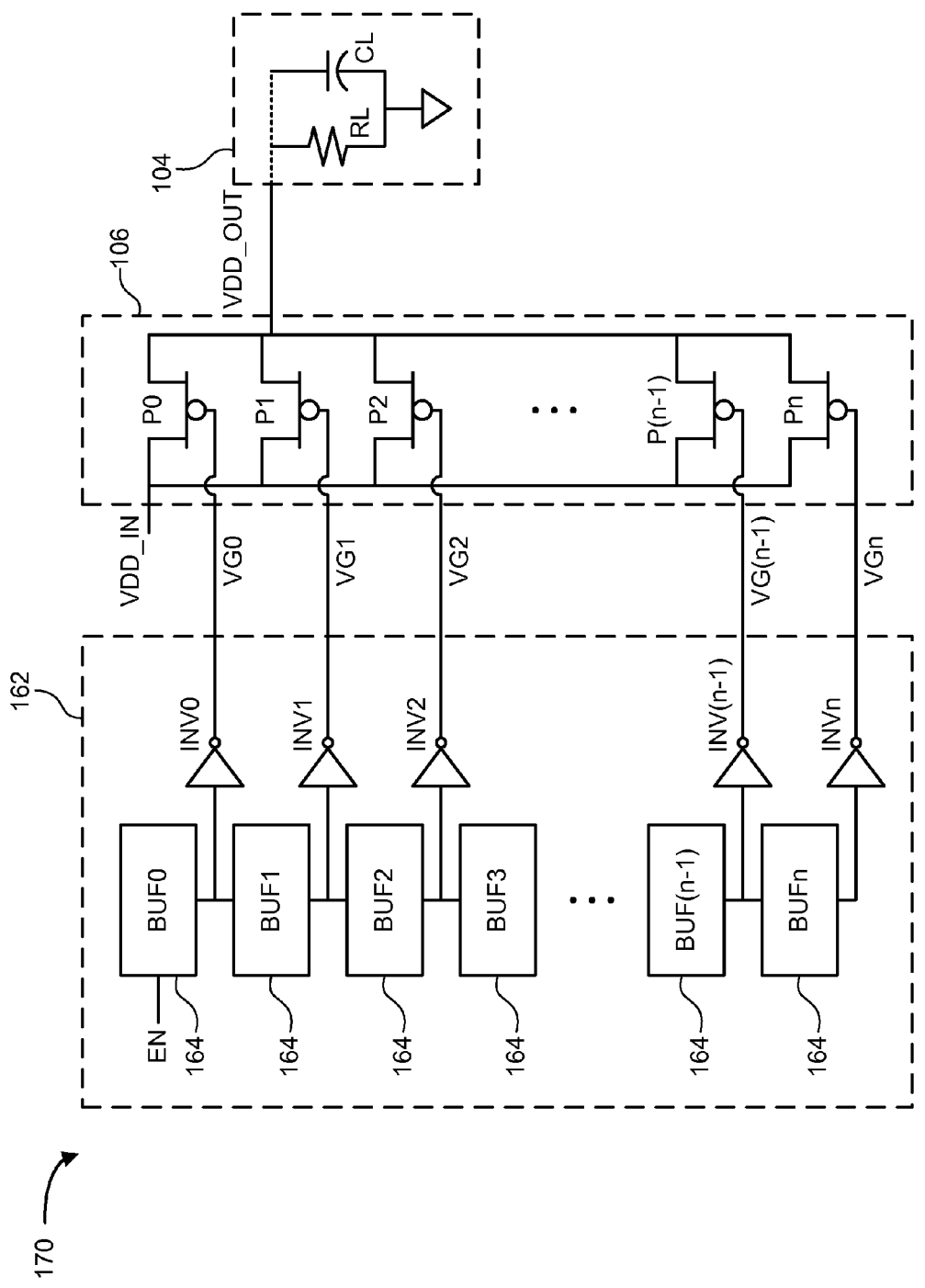
FIG. 8 depicts a schematic diagram of another embodiment of an electronic device with a specific implementation of the switch controller of FIG. 6.

FIG. 8 depicts a schematic diagram of another embodiment of an electronic device 170 with a specific implementation of the switch controller 108 of FIG. 6. In particular, the switch controller 108 is implemented as a delay network 162. The delay network 162 receives an enable signal (EN) as input and directs the enable signal through an arrangement of buffers (BUF0-BUFn). Specifically, the illustrated arrangement implements a plurality of cascaded buffers BUF0-BUFn. Each buffer BUF0-BUFn may be implemented using similar technology as the buffer 164 of FIG. 7. Additionally, each buffer BUF0-BUFn may have the same delay or a different delay relative to the other buffers BUF0-BUFn in the cascaded buffer chain.

In one embodiment, the output of each buffer BUF0-BUFn provides a delayed enable signal to the subsequent buffer BUF0-BUFn, if applicable, and to a corresponding inverter (INV0-INVn). Some embodiments may exclude one or more of the independent inverters INV0-INVn. Other embodiments may include additional inverters INV0-INVn. Each inverter INV0-INVn outputs a switch control signal (VG0-VGn) to a corresponding PMOS switch (P0-Pn) within the load switch 106.

The load switch 106 is substantially similar to the load switch 106 shown in FIG. 5 and described above. In particular, the load switch 106 of FIG. 8 includes a plurality of PMOS high side switches P0-P1, and each gate of each PMOS high side switch is coupled to one of the buffers BUF0-BUFn of the delay circuit 162 (e.g., via the inverters INV0-INVn). The load switch 106 also includes a common input voltage (VDD_IN) channel coupled to the sources of all of the PMOS high side switches, and a common output voltage (VDD_OUT) channel coupled to the drains of all of the PMOS high side switches. The common output voltage channel is configured to present the load voltage to the load 104, as described above. The load voltage may be an individual load voltage from a single PMOS high side switch P0-Pn or a cumulative signal from at least two of the PMOS high side switches P0-Pn.

Figure 9:
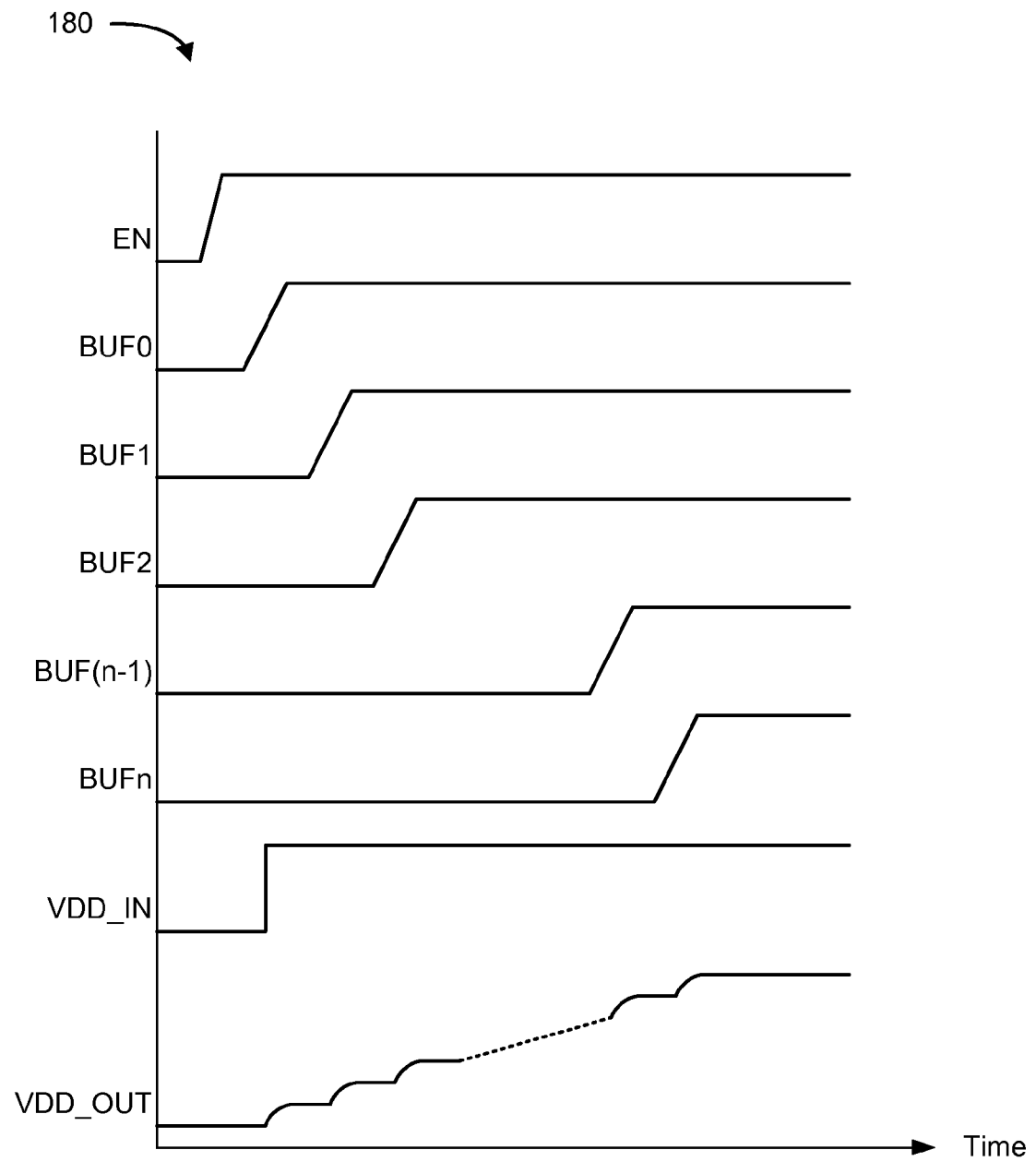
FIG. 9 depicts a timing diagram for the switch controller and the load switch of the electronic device of FIG. 8.

As one example of the operation of the electronic device 170, the delay circuit 162 receives the enable signal (EN) to activate and control the slew rate of the load switch 106. FIG. 9 depicts a timing diagram 180 for the switch controller 108 and the load switch 106 of the electronic device 170 of FIG. 8. When EN goes high, for example, the output of the first buffer BUF0 goes high after a time delay, td0, corresponding to the first buffer BUF0. The first inverter INV0 then presents a voltage (e.g., GND) to the gate of the first PMOS switch P0, which at least partially turns on the first PMOS switch P0. This allows the common input voltage VDD_IN to at least partially pass through to the load 104.

After a second time delay, td1, the output of the second buffer BUF1 goes high and the second inverter INV 1 turns on the second PMOS switch P1. This allows the common input voltage VDD_IN to pass through both the first and second PMOS switches P0 and P1 to the load 104. The delayed enable signal continues through the delay network 162 sequentially turning on each PMOS switch P0-Pn in the load switch 106 and, hence, increasing over time the load voltage presented to the load 104. Thus, after tdn time delay, the output of BUFn will go high, which will turn on the last PMOS switch Pn, and all the switches will be on. With each additional PMOS switch that turns on, the total turn on resistance decreases and, hence, the rising slope will increase relative to the initial slope.

In one embodiment, the delay network 162 includes the initial delay buffer BUF0 in order to delay turning on the load switch 106 by a corresponding amount of time. By initially delaying turning on the load switch 106, the electronic circuit 170 may suppress the switching noise from the power supply. The other electronic circuits 120 and 150 described above similarly may include some type of delay logic to initially delay turning on the load switch 106. However, other embodiments of the electronic circuits 120, 150, and 170 may omit the initial delay buffer BUF0 so that there is minimal or no delay before turning on the load switch 106.

It should also be noted that the illustrated electronic device 170 does not require a clock signal for operation. Rather, embodiments of the electronic device 170 control the slew rate of the load switch 106 using only the enable signal (or another initialization signal) and some arrangement of combinational logic. The amount of delay at each stage, or total delay, may be adjusted by using more or less combinational logic or bigger or smaller transistors in the inverter chain buffers BUF0-BUFn.

According to the various embodiments of electronic devices described herein, as well as equivalent devices which might be implemented, some embodiments of the slew rate controller 102 provide certain advantages over conventional technology. In particular, some embodiments of the slew rate controller 102 facilitate better control over the slew rate of the load switch 106 by discretely adjusting the load voltage presented to the load 104 over time. Additionally, some embodiments may facilitate delaying the initial start of turn on of the load switch in order to suppress switching noise from the power supply. Other embodiments may exhibit additional advantages over the conventional technology.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or Arrangements of parts so described and illustrated. The scope of the invention is to be defined by the claims appended hereto and their equivalents.

What is claimed is:

1. An apparatus for slew rate control, the apparatus comprising:
a load switch to output a load voltage to a load; and
a switch controller coupled to the load switch, the switch controller to generate a switch control signal in response to an enable signal, the switch control signal to control operation of the load switch, wherein the switch controller comprises:
a resistive network; and
a resistive network controller coupled to the resistive network, wherein the resistive network controller is configured to independently control switches within the resistive network, wherein the resistive network controller comprises:
a counter to advance a count in response to a clock signal while the enable signal is asserted; and
a decoder coupled to the counter, the decoder to generate a plurality of resistive network control signals, wherein the decoder sends one of the resistive network control signals to a corresponding switch within the resistive network via a corresponding resistive network control channel coupled between the decoder and the corresponding switch;
wherein the switch controller is configured to control a slew rate of the load switch according to a plurality of discrete slew rate levels.

2. The apparatus of claim 1, wherein the switch controller is further configured to discretely vary a magnitude of the switch control signal to control the slew rate of the load switch.

3. The apparatus of claim 2, wherein the switch controller is further configured to send the switch control signal to the load switch to change the load voltage, which is output by the load switch, from an initial load voltage to a final load voltage over a period of time.

4. The apparatus of claim 1, wherein:
the resistive network comprises a plurality of resistors and a corresponding plurality of switches; and
the resistive network controller is further configured to control the plurality of switches to generate a plurality of voltage levels, wherein each voltage level corresponds to a discrete magnitude of the switch control signal.

5. The apparatus of claim 4, wherein the resistors and switches within the resistive network form a plurality of voltage divider arrangements.

6. The apparatus of claim 4, wherein the resistive network further comprises:
a voltage source (VDD) channel, wherein the resistors are arranged in series between the voltage source channel and a ground reference; and
a common output channel coupled to all of the switches and to the load switch, wherein the common output channel presents the switch control signal from the resistive network to the load switch.

7. The apparatus of claim 6, wherein the load switch comprises a single p-type metal-oxide semiconductor (PMOS) high side switch.

8. The apparatus of claim 1, wherein the resistive network controller further comprises:
power on reset (POR) logic to generate a power on reset signal; and
reset logic coupled to the power on reset logic, the reset logic to generate a reset signal based on the power on reset signal and the enable signal, wherein the counter is further configured to reset the count in response to the reset signal from the reset logic.

9. An electronic device, comprising:
a load chip with electronic circuitry;
a load switch coupled to the load chip, the load switch to supply a load voltage to the load chip; and
a switch controller coupled to the load switch, the switch controller to control a slew rate of the load switch according to a plurality of discrete slew rate levels, wherein the switch controller comprises:
a resistive network; and
a resistive network controller coupled to the resistive network, the resistive network controller to activate the resistive network to generate a switch control signal in response to an enable signal, wherein the switch control signal varies over time according to the plurality of discrete slew rate levels, wherein the resistive network controller comprises:
a counter to advance a count in response to a clock signal while the enable signal is asserted; and
a decoder coupled to the counter, the decoder to generate a plurality of resistive network control signals, wherein the decoder sends one of the resistive network control signals to a corresponding switch within the resistive network via a corresponding resistive network control channel coupled between the decoder and the corresponding switch.

* * * * *